(12) United States Patent
Sawano

(10) Patent No.: US 12,531,426 B2
(45) Date of Patent: Jan. 20, 2026

(54) SWITCH DEVICE, CURRENT DETERMINATION METHOD AND COMPUTER PROGRAM

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Shunichi Sawano, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

(*) Notice: Subject to any disclaimer, the term of this patent is extended or adjusted under 35 U.S.C. 154(b) by 892 days.

(21) Appl. No.: 17/784,823

(22) PCT Filed: Nov. 26, 2020

(86) PCT No.: PCT/JP2020/043937
§ 371 (c)(1),
(2) Date: Jun. 13, 2022

(87) PCT Pub. No.: WO2021/117492
PCT Pub. Date: Jun. 17, 2021

(65) Prior Publication Data
US 2023/0008237 A1     Jan. 12, 2023

(30) Foreign Application Priority Data

Dec. 13, 2019   (JP) ................................ 2019-225848

(51) Int. Cl.
*H02J 7/00* (2006.01)
*H02J 7/18* (2006.01)

(52) U.S. Cl.
CPC .............. *H02J 7/0024* (2013.01); *H02J 7/18* (2013.01)

(58) Field of Classification Search
CPC .......... H02J 1/06; H02J 7/0024; H02J 7/0063; H02J 7/18; H02J 2310/46
(Continued)

(56) References Cited

U.S. PATENT DOCUMENTS

2019/0260338 A1*   8/2019   Oda ..................... H03F 3/45475
2020/0203985 A1*   6/2020   Tagawa ..................... H02J 7/34

FOREIGN PATENT DOCUMENTS

JP    2018011411 A   *   1/2018
JP    2019205252 A   *   11/2019

OTHER PUBLICATIONS

Machine translation of Sumino Japanese Patent Document JP 2018-11411 A Jan. 2018 (Year: 2018).*

(Continued)

*Primary Examiner* — Kevin J Comber
(74) *Attorney, Agent, or Firm* — Honigman LLP

(57) ABSTRACT

A load is detachably connected to a device connector of a switch device. A resistance value of a switch circuit when a sub-switch is ON is greater than an ON resistance value of a main switch. A microcomputer acquires node voltage information indicating a node voltage of a connection node located downstream of the main switch and the sub-switch from a voltage detection unit in a state where the main switch is OFF and the sub-switch is ON. The microcomputer determines whether a switch current that flows via the main switch when the main switch turns ON will be less than a current threshold value, based on the acquired node voltage information.

12 Claims, 10 Drawing Sheets

(58) Field of Classification Search
USPC .......................................................... 361/93.9
See application file for complete search history.

(56) References Cited

OTHER PUBLICATIONS

Machine translation of Maesaki Japanese Patent Document JP 2019-205252 A Nov. 2019 (Year: 2019).*
International Search Report, Application No. PCT/JP2020/043937, mailed Mar. 2, 2021. ISA/Japan Patent Office.

* cited by examiner

SWITCH DEVICE, CURRENT DETERMINATION METHOD AND COMPUTER PROGRAM

CROSS-REFERENCE TO RELATED APPLICATIONS

This application is the U.S. national stage of PCT/JP2020/043937 filed on Nov. 26, 2020, which claims priority of Japanese Patent Application No. JP 2019-225848 filed on Dec. 13, 2019, the contents of which are incorporated herein.

TECHNICAL FIELD

The present disclosure relates to a switch device, a current determination method and a computer program.

BACKGROUND

JP 2019-146385A discloses a vehicular switch device in which a switch is disposed on a current path from a DC (Direct Current) power source to a load. In this switch device, power supply from the DC power source to the load is controlled by turning the switch ON or OFF.

Examples of a conventional switch device in which a switch is disposed on the current path from a DC power source to a load include a switch device having a connector that is detachably connected to the load. With this switch device, when the switch is ON, the DC power source supplies power to the load via the switch and the connector. The current that flows via the switch is larger, the lower is the resistance component value of the load that is connected to the connector. In the case where a load with a low resistance component value is connected to the connector, an overcurrent could possibly flow to the connector via the switch.

In view of this, an object is to provide a switch device, a current determination method and a computer program that can prevent flow of an overcurrent.

A switch device according to one mode of the disclosure includes a connector to be detachably connected to a load, a main switch to be provided on a first current path from a DC power source to the connector, a switch circuit to be provided on a second current path from the DC power source to the connector and including a sub-switch, and a processing unit configured to execute processing, a resistance value of the switch circuit when the sub-switch is ON being greater than an ON resistance value of the main switch, and the processing unit executing processing for acquiring node voltage information indicating a node voltage of a connection node located downstream of the main switch and the sub-switch, in a state where the main switch is OFF and the sub-switch is ON, and determining whether a switch current that flows via the main switch when the main switch turns ON will be less than a current threshold value, based on the acquired node voltage information.

In a current determination method according to one mode of the disclosure, a computer executes a step of acquiring node voltage information indicating a node voltage of a connection node located downstream of a main switch and a sub-switch, in a state where the main switch is OFF and the sub-switch is ON, the main switch being provided on a first current path from a DC power source to a connector detachably connected to a load and the sub-switch being included in a switch circuit provided on a second current path from the DC power source to the connector, and a step of determining whether a switch current that flows via the main switch when the main switch turns ON will be less than a current threshold value, based on the acquired node voltage information, a resistance value of the switch circuit when the sub-switch is ON being greater than an ON resistance value of the main switch.

A computer program according to one mode of the disclosure is for use in causing a computer to execute a step of acquiring node voltage information indicating a node voltage of a connection node located downstream of a main switch and a sub-switch, in a state where the main switch is OFF and the sub-switch is ON, the main switch being provided on a first current path from a DC power source to a connector detachably connected to a load and the sub-switch being included in a switch circuit provided on a second current path from the DC power source to the connector, and a step of determining whether a switch current that flows via the main switch when the main switch turns ON will be less than a current threshold value, based on the acquired node voltage information, a resistance value of the switch circuit when the sub-switch is ON being greater than an ON resistance value of the main switch.

Note that the disclosure can be realized not only as a switch device that includes such characteristic processing units, but also as a current determination method that includes the characteristic processing as steps, or as a computer program for causing a computer to execute these steps. Also, the disclosure can be realized as a semiconductor integrated circuit that realizes all or part of the switch device, or as a power system that includes the switch device.

Advantageous Effects of Invention

According to the disclosure, flow of an overcurrent can be prevented.

DETAILED DESCRIPTION OF PREFERRED EMBODIMENTS

Figure 1:
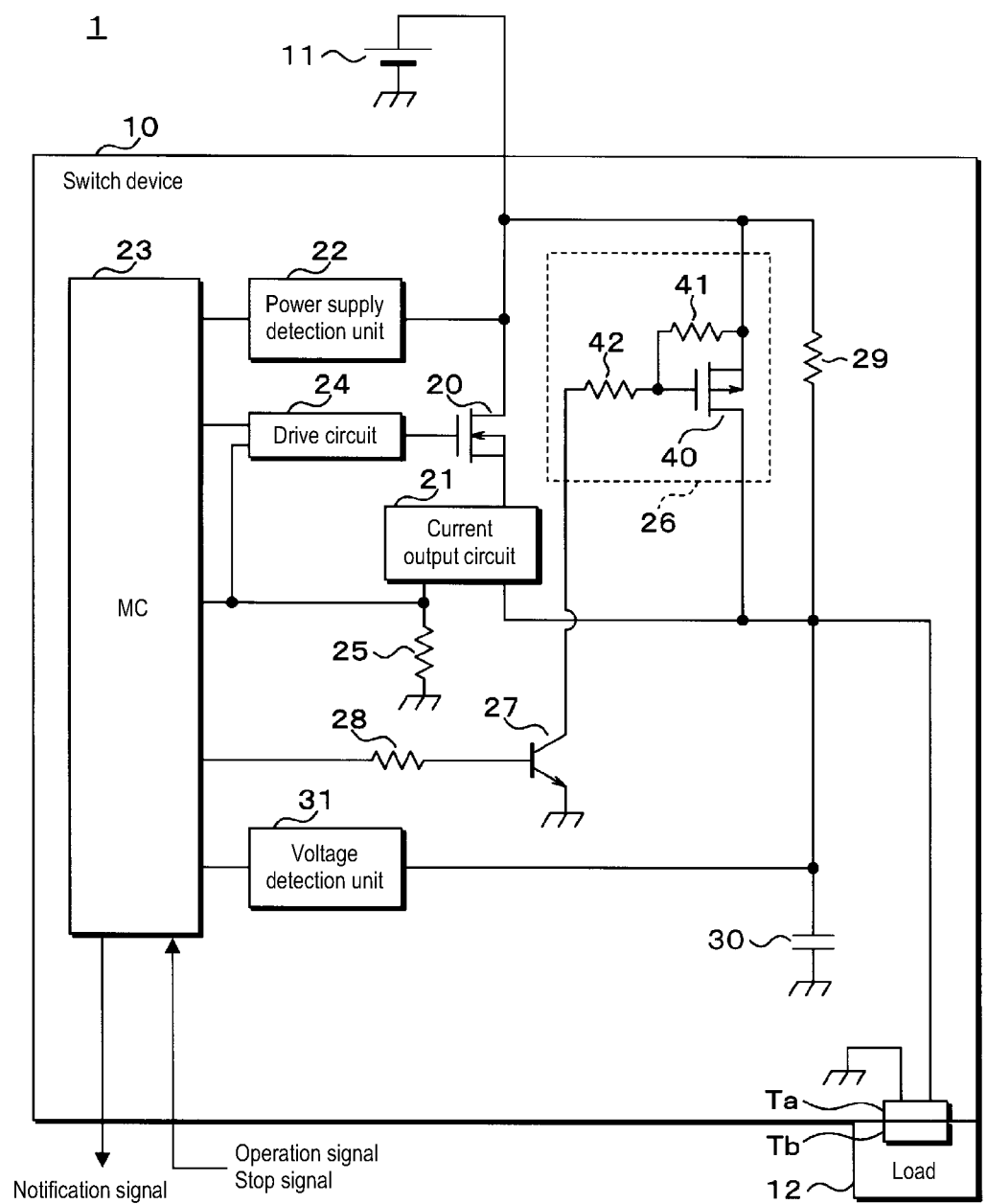
FIG. 1 is a block diagram showing the main configuration of a power system in a first embodiment.

Initially, modes for carrying out the disclosure will be enumerated and described. At least some of the modes described below may be discretionarily combined.
First Aspect A switch device according to a first aspect of the disclosure includes a connector to be detachably connected to a load, a main switch to be provided on a first current path from a DC power source to the connector, a switch circuit to be provided on a second current path from the DC power source to the connector and including a sub-switch, and a processing unit configured to execute processing, a resistance value of the switch circuit when the sub-switch is ON being greater than an ON resistance value of the main switch, and the processing unit executing processing for acquiring node voltage information indicating a node voltage of a connection node located downstream of the main switch and the sub-switch, in a state where the main switch is OFF and the sub-switch is ON, and determining whether a switch current that flows via the main switch when the main switch turns ON will be less than a current threshold value, based on the acquired node voltage information.

Second Aspect

In the switch device according to a second aspect of the disclosure, the processing unit executes processing for calculating a resistance component value of the load based on the acquired node voltage information, and determining whether the switch current that flows when the main switch turns ON will be less than the current threshold value, based on the calculated resistance component value.

Third Aspect

The switch device according to a third aspect of the disclosure includes a resistor to be provided on a third current path from the DC power source to the connector and connected at one end to the connection node, and a capacitor connected at one end to the connection node, and the processing unit executes processing for acquiring the node voltage information in a state where the main switch and the sub-switch are OFF, and determining whether the load is connected to the connector based on the node voltage information acquired in the state where the main switch and the sub-switch are OFF.

Fourth Aspect

In the switch device according to a fourth aspect of the disclosure, the processing unit, in a case of having determined that the load is connected to the connector, executes processing for acquiring the node voltage information in a state where the main switch is OFF and the sub-switch is ON.

Fifth Aspect

In the switch device according to a fifth aspect of the disclosure, a resistance value of the resistor is greater than the resistance value of the switch circuit when the sub-switch is ON.

Sixth Aspect

In the switch device according to a sixth aspect of the disclosure, the processing unit executes processing for acquiring current information indicating the switch current, when the main switch is ON, and determining whether the load is connected to the connector based on the acquired current information.

Seventh Aspect

In the switch device according to a seventh aspect of the disclosure, the switch circuit has a second resistor connected in series to the sub-switch.

Eighth Aspect

In the switch device according to an eighth aspect of the disclosure, the processing unit halts operation, and the processing unit, in a case of having resumed operation, executes processing for acquiring the node voltage information in a state where the main switch is OFF and the sub-switch is ON.

Ninth Aspect

In the switch device according to a ninth aspect of the disclosure, a current that flows when a load having a resistance component value of 0 ohms is connected to the connector and the main switch and the sub-switch are respectively OFF and ON is a normal value that does not cause smoke to be generated.

Tenth Aspect

In a current determination method according to a tenth aspect of the disclosure, a computer executes a step of acquiring node voltage information indicating a node voltage of a connection node located downstream of a main switch and a sub-switch, in a state where the main switch is OFF and the sub-switch is ON, the main switch being provided on a first current path from a DC power source to a connector detachably connected to a load and the sub-switch being included in a switch circuit provided on a second current path from the DC power source to the connector, and a step of determining whether a switch current that flows via the main switch when the main switch turns ON will be less than a current threshold value, based on the acquired node voltage information, a resistance value of the switch circuit when the sub-switch is ON being greater than an ON resistance value of the main switch.

Eleventh Aspect

A computer program according to an eleventh aspect of the disclosure is for use in causing a computer to execute a step of acquiring node voltage information indicating a node voltage of a connection node located downstream of a main switch and a sub-switch, in a state where the main switch is OFF and the sub-switch is ON, the main switch being provided on a first current path from a DC power source to a connector detachably connected to a load and the sub-switch being included in a switch circuit provided on a second current path from the DC power source to the connector, and a step of determining whether a switch current that flows via the main switch when the main switch turns ON will be less than a current threshold value, based on the acquired node voltage information, a resistance value of the switch circuit when the sub-switch is ON being greater than an ON resistance value of the main switch.

With the switch device, current determination method and computer program according to the above modes, the sub-switch is turned ON before turning ON the main switch, and node voltage information is acquired. When the main switch is OFF and the sub-switch is ON in the case where a load is connected to the connector, the node voltage is a voltage obtained by the switch circuit and the load dividing the voltage of the DC power source, and is higher, the higher is the resistance component value of the load. The switch current that flows when the main switch is turned ON is smaller, the higher is the resistance component value of the load. Accordingly, the switch current that flows when the main switch is turned ON is smaller, the higher is the node voltage.

It is determined whether the switch current that flows when the main switch turns ON will be less than a current threshold value, based on the node voltage information, that is, the node voltage. If it is determined that the switch current will be less than the current threshold value, the main switch is turned ON. Flow of an overcurrent exceeding the current threshold value is thus prevented.

With the switch device according to the above modes, the resistance component value of the load is calculated, based on the node voltage when the main switch is OFF and the sub-switch is ON. It is determined whether the switch current that flows when the main switch turns ON will be less than the current threshold value, based on the calculated resistance component value.

With the switch device according to the above modes, when the main switch and the sub-switch are OFF in the case where a load is not connected to the connector, the capacitor is charged until the end-to-end voltage of the capacitor equals the voltage of the DC power source. Accordingly, the end-to-end voltage of the capacitor is high. On the other hand, when the main switch and the sub-switch are OFF in the case where a load is connected to a connector, the capacitor discharges until the end-to-end voltage of the capacitor equals a voltage obtained by the resistor and the load dividing the voltage of the DC power source. Accordingly, the end-to-end voltage of the capacitor is low. Accordingly, it can be determined whether a load is connected to the connector, based on the node voltage, that is, the end-to-end voltage of the capacitor, when the main switch and the sub-switch are OFF.

With the switch device according to the above modes, the node voltage information is acquired in a state where the main switch is OFF and the sub-switch is ON, if it is determined that a load is connected to the connector. Thereafter, it is determined whether the switch current that flows when the main switch turns ON will be less than the current threshold value.

With the switch device according to the above modes, the resistance value of the resistor is high, and thus the current that flows via the resistor is substantively 0 A, when one of the main switch and the sub-switch is ON.

With the switch device according to the above modes, the switch current flows when a load is connected to the connector, in the case where the main switch is ON. On the other hand, the switch current does not flow when a load is not connected to the connector, in the case where the main switch is ON. In the case where the main switch is ON, it can thus be determined whether a load is connected to the connector, based on the switch current.

With the switch device according to the above modes, an overcurrent needs to be prevented from flowing via the switch circuit when the sub-switch is turned ON. Accordingly, the resistance value of the switch circuit when the sub-switch is ON is preferably high. Because the second resistor is connected in series to the sub-switch, a switch circuit having a high resistance value when the sub-switch is ON can be realized, even in the case where the ON resistance value of the sub-switch is low.

With the switch device according to the above modes, the processing unit, in the case of resuming operation, determines whether the switch current that flows when the main switch turns ON will be less than the current threshold value, based on node voltage information acquired in a state where the main switch is OFF and the sub-switch is ON. Accordingly, the main switch 20 will not be mistakenly turned ON in the case where the load that is connected to the connector is changed to a load having a low resistance component value, while the processing unit is halted.

With the switch device according to the above modes, the resistance value of the switch circuit when the sub-switch is ON is high. The current that flows when a load having a resistance component value of 0 ohms is connected to the connector and the main switch and the sub-switch are respectively OFF and ON is thus small and will not cause smoke to be generated.

Specific examples of a power system according to embodiments of the disclosure will be described below with reference to the drawings. Note that the present invention is not limited to these illustrative examples and is defined by the claims, and all changes that come within the meaning and range of equivalency of the claims are intended to be embraced therein.

First Embodiment

Configuration of Power System

FIG. 1 is a block diagram showing the main configuration of a power system 1 in a first embodiment. The power system 1 is suitably mounted in a vehicle and includes a switch device 10, a DC power source 11 and a load 12. The switch device 10 has a main switch 20 and a device connector Ta. The load 12 has a load connector Tb. The switch device 10 is connected to a positive electrode of the DC power source 11. A negative electrode of the DC power source 11 is grounded. The device connector Ta is detachably connected to the load connector Tb. The load 12 is connected to the device connector Ta, due to the load connector Tb being connected to the device connector Ta.

The DC power source 11 is a battery, for example. The load 12 is an electrical device that is brought into the vehicle, for example, and has a resistance component. The load 12 operates when power that is supplied to the load 12 is greater than or equal to a given power. The given power has a value exceeding 0 W. The load 12 stops operating when power that is supplied to the load 12 is less than the given power.

When the main switch 20 is turned from OFF to ON in the case where the load 12 is connected to the device connector Ta, the DC power source 11 supplies power to the load 12 via the main switch 20 and the device connector Ta. At this time, the power that is supplied to the load 12 is greater than or equal to the given power, and the load 12 operates. When the main switch 20 is turned from ON to OFF in the same case, the power that the DC power source 11 supplies to the load 12 decreases to a power that is less than the given power, and the load 12 stops operating.

An operation signal for instructing that the load 12 be operated and a stop signal for instructing that operation of the load 12 be stopped are input to the switch device 10. When the operation signal is input to the switch device 10, the main switch 20 is turned ON and the load 12 is operated. When the stop signal is input to the switch device 10, the main switch 20 is turned OFF and operation of the load 12 is stopped.

When the load 12 to which an overcurrent could possibly flow via the switch device 10 is connected to the device connector Ta, a notification signal indicating that it is not possible to supply power to the load 12 is output by the switch device 10 to a device not shown. When the operation signal is input to the switch device 10 in a state where the load 12 is not connected to the device connector Ta, a notification signal indicating that the load 12 is disconnected is output by the switch device 10 to the device not shown.

Configuration of Switch Device 10

In addition to the main switch 20 and the device connector Ta, the switch device 10 has a current output circuit 21, a power supply detection unit 22, a microcomputer (hereinafter, MC) 23, a drive circuit 24, a current resistor 25, a switch circuit 26, a selector switch 27, a switch resistor 28, a circuit resistor 29, a capacitor 30 and a voltage detection unit 31. The switch circuit 26 has a sub-switch 40 and switch resistors 41 and 42. The main switch 20 is an N-channel FET (Field Effect Transistor). The selector switch 27 is an NPN bipolar transistor. The sub-switch 40 is a P-channel FET.

The drain of the main switch 20 is connected to the positive electrode of the DC power source 11. The source of the main switch 20 is connected to the current output circuit 21. The current output circuit 21 is further connected to the device connector Ta. The device connector Ta is grounded. When the load 12 is connected to the device connector Ta, the load 12 is grounded together with being connected to the current output circuit 21.

The drain of the main switch 20 is further connected to the power supply detection unit 22. The power supply detection unit 22 is connected to the MC 23. The gate of the main switch 20 is connected to the drive circuit 24. The drive circuit 24 is further connected to the MC 23. The current output circuit 21 is further connected to one end of the current resistor 25. The other end of the current resistor 25 is grounded. A connection node located between the current output circuit 21 and the current resistor 25 is connected to the MC 23 and the drive circuit 24.

The drain of the main switch 20 is further connected to the source of the sub-switch 40 of the switch circuit 26. The drain of the sub-switch 40 is connected to a connection node located between the current output circuit 21 and the device connector Ta. In the switch circuit 26, the switch resistor 41 is connected between the source and the gate of the sub-switch 40. The gate of the sub-switch 40 is further connected to one end of the switch resistor 42. The other end of the switch resistor 42 is connected to a collector of the selector switch 27. An emitter of the selector switch 27 is grounded. A base of the selector switch 27 is connected to one end of the switch resistor 28. The other end of the switch resistor 28 is connected to the MC 23.

The drain of the main switch 20 is further connected to one end of the circuit resistor 29. The other end of the circuit resistor 29 is connected to a connection node located between the current output circuit 21 and the device connector Ta. This connection node is further connected to one end of the capacitor 30 and to the voltage detection unit 31. The other end of the capacitor 30 is grounded. The voltage detection unit 31 is connected to the MC 23.

The power supply detection unit 22 detects the voltage of the DC power source 11 relative to the ground potential. Hereinafter, the voltage of the DC power source 11 relative to the ground potential will be described as a power supply voltage.

The power supply detection unit 22 outputs power supply voltage information indicating the detected power supply voltage to the MC 23. The power supply voltage information is an analog value, and is a voltage proportional to the detected power supply voltage, for example. The DC power source 11 also supplies power to one or more second loads not shown, in addition to the load 12. The positive electrode of the DC power source 11 is connected not only to the switch device 10 but also to the one or more second loads. The power supply voltage of the DC power source 11 varies, according to the current flowing from the DC power source 11. The power supply voltage is lower, the larger is the current flowing from the DC power source 11.

In the main switch 20, the resistance value between the drain and the source is sufficiently low, when the gate to source voltage is greater than or equal to a given voltage. At this time, the main switch 20 is ON and current can flow via the drain and the source. In the main switch 20, the resistance value between the drain and the source is sufficiently high, when the gate to source voltage is less than the given voltage. At this time, the main switch 20 is OFF and current will not flow via the drain and the source.

An operation signal and a stop signal are input to the MC 23. When the operation signal is input to the MC 23, an ON instruction for instructing that the main switch 20 be turned ON is output to the drive circuit 24. When the ON instruction is input to the drive circuit 24, the drive circuit 24 increases the voltage of the gate of the main switch 20 relative to the ground potential. In the main switch 20, the gate to source voltage thereby increases to greater than or equal to the given voltage, and the main switch 20 turns ON.

When the stop signal is input to the MC 23, the MC 23 outputs an OFF instruction for instructing that the main switch 20 be turned OFF to the drive circuit 24. When the OFF instruction is input to the drive circuit 24, the voltage of the gate of the main switch 20 relative to the ground potential is reduced. In the main switch 20, the gate to source voltage thereby decreases to less than the given voltage, and the main switch 20 turns OFF. As described above, the drive circuit 24 turns the main switch 20 ON or OFF.

When the main switch 20 is ON in the case where the load 12 is connected to the device connector Ta, current flows from the positive electrode of the DC power source 11 in order of the main switch 20, the current output circuit 21, the device connector Ta and the load 12. The load 12 thereby operates. Hereinafter, the current that flows from the DC power source 11 in order of the main switch 20 and the current output circuit 21 and is output from the end of the current output circuit 21 on the device connector Ta side will be described as a switch current.

The current path of current that flows from the positive electrode of the DC power source 11 in order of the main switch 20, the current output circuit 21 and the device connector Ta corresponds to a first current path. The main switch 20 is provided on the first current path.

When the switch current flows, the current output circuit 21 outputs a current obtained by dividing the switch current by a predetermined number to the current resistor 25. The current output circuit 21 includes a current mirror circuit, for example. The predetermined number is 1000, for example. The end-to-end voltage of the current resistor 25 is input as current information to the MC 23 and the drive circuit 24.

The switch current, the resistance value of the current resistor 25 and the predetermined number will be respectively denoted as Is, rc and N. The end-to-end voltage of the current resistor 25 is calculated by Is·rc/N. The symbol "·" represents product. The resistance value rc and the predetermined number N are given values. The end-to-end voltage of the current resistor 25 is thus proportional to the switch current Is, and the current information indicates the switch current Is.

When the main switch 20 turns OFF in the case where the DC power source 11 is supplying power to the load 12 via the main switch 20, the power that is supplied to the load 12 by the DC power source 11 decreases to less than the given power, and the load 12 stops operating.

When the load 12 is not connected to the device connector Ta, the switch current will not flow regardless of whether or not the main switch 20 is ON. The switch current also will not flow when the main switch 20 is OFF. When the switch current does not flow, the current output circuit 21 does not output current to the current resistor 25, and 0 V is input to the MC 23 and the drive circuit 24 as current information.

The drive circuit 24 turns OFF the main switch 20 when the switch current indicated by the input current information exceeds a cutoff threshold value, regardless of the signal input from the MC 23. After turning OFF the main switch 20, the drive circuit 24 keeps the main switch 20 OFF, regardless of the input current information. The cutoff threshold value is a given value and is set in advance.

Regarding the selector switch 27, the resistance value between the collector and the emitter is sufficiently low, when the base to emitter voltage is greater than or equal to a given voltage. At this time, the selector switch 27 is ON and current can flow via the collector and the emitter. Regarding the selector switch 27, the resistance value between the collector and the emitter is sufficiently high, when the base to emitter voltage is less than the given voltage. At this time, the selector switch 27 is OFF and current will not flow via the collector and the emitter.

The MC 23 increases the voltage of the base of the selector switch 27 relative to the ground potential. In the selector switch 27, the base to emitter voltage thereby increases to greater than or equal to the given voltage, and the selector switch 27 turns ON. The MC 23 reduces the voltage of the base of the selector switch 27 relative to the ground potential. In the selector switch 27, the base to emitter voltage thereby decreases to less than the given voltage, and the selector switch 27 turns OFF. As described above, the MC 23 turns the selector switch 27 ON or OFF.

Regarding the sub-switch 40 of the switch circuit 26, the resistance value between the source and the drain is sufficiently low, when the gate to source voltage is less than a given voltage. At this time, the sub-switch 40 is ON and current can flow via the source and the drain. Regarding the sub-switch 40 of the switch circuit 26, the resistance value between the source and the drain is sufficiently high, when the gate to source voltage is greater than or equal to the given voltage. At this time, the sub-switch 40 is OFF and current will not flow via the source and the drain. The given voltage relating to the sub-switch 40 is less than 0 V.

When the selector switch 27 is OFF, current will not flow in order of the switch resistors 41 and 42. At this time, in the sub-switch 40, the gate to source voltage is 0 V and exceeds the given voltage. As a result, the sub-switch 40 is OFF. When the MC 23 turns ON the selector switch 27, current flows in order of the switch resistors 41 and 42. At this time, in the sub-switch 40, the gate to source voltage decreases to less than the given voltage, and the sub-switch 40 turns ON. When the MC 23 turns OFF the selector switch 27, flow of current via the switch resistors 41 and 42 stops. In the sub-switch 40, the gate to source voltage thereby increases to 0 V and exceeds the given voltage. As a result, the sub-switch 40 turns OFF. As described above, the MC 23 turns ON the sub-switch 40 by turning ON the selector switch 27, and turns OFF the sub-switch 40 by turning OFF the selector switch 27.

The ON resistance value of the sub-switch 40, that is, the resistance value of the switch circuit 26 when the sub-switch 40 is ON, is sufficiently higher than the ON resistance value of the main switch 20. The resistance value of the circuit resistor 29 is sufficiently higher than the ON resistance value of the sub-switch 40, that is, the resistance value of the switch circuit 26 when the sub-switch 40 is ON. The ON resistance value of the main switch 20 is a few ohms, for example. The ON resistance value of the sub-switch 40 is a resistance value belonging to a range of a few hundred ohms to a few kilohms, for example. The ON resistance value of an N-channel FET is generally not more than a few ohms. A P-channel FET having a high ON resistance value is thus used as the sub-switch 40. The circuit resistance is a few megaohms, for example. The ON resistance value of the switch is the resistance value of the switch when the switch is ON.

The voltage detection unit 31 detects the voltage of the connection node located between the current output circuit 21 and the device connector Ta. Hereinafter, the voltage of the connection node located between the current output circuit 21 and the device connector Ta will be described as a node voltage. The node voltage is a voltage relative to the ground potential. When the node voltage is detected, the voltage detection unit 31 outputs node voltage information indicating the detected node voltage to the MC 23. The node voltage information is an analog value, and indicates a voltage proportional to the node voltage, for example.

The MC 23 determines whether the load 12 is connected to the device connector Ta, based on the node voltage information acquired from the voltage detection unit 31 in a state where the main switch 20 and the sub-switch 40 are OFF. If it is determined that the load 12 is connected to the device connector Ta, the MC 23 calculates the resistance component value of the load 12, based on the power supply voltage information and the node voltage information acquired from the power supply detection unit 22 and the voltage detection unit 31 in a state where the main switch 20 is OFF and the sub-switch 40 is ON.

The MC 23 determines whether the switch current that flows when the main switch 20 turns ON will be less than a current threshold value, based on the calculated resistance component value. The current threshold value is a given value and is set in advance. The current threshold value is less than the aforementioned cutoff threshold value. If it is determined that the switch current will be less than the current threshold value, the MC 23 turns the main switch 20 ON or OFF, in accordance with the input signal. The MC 23 outputs a notification signal, if it is determined that the switch current that flows when the main switch 20 turns ON will be greater than or equal to the current threshold value, or if the operation signal is input in a state where the load 12 not connected to the device connector Ta.

Operation Example of Switch Device 10

Figure 2:
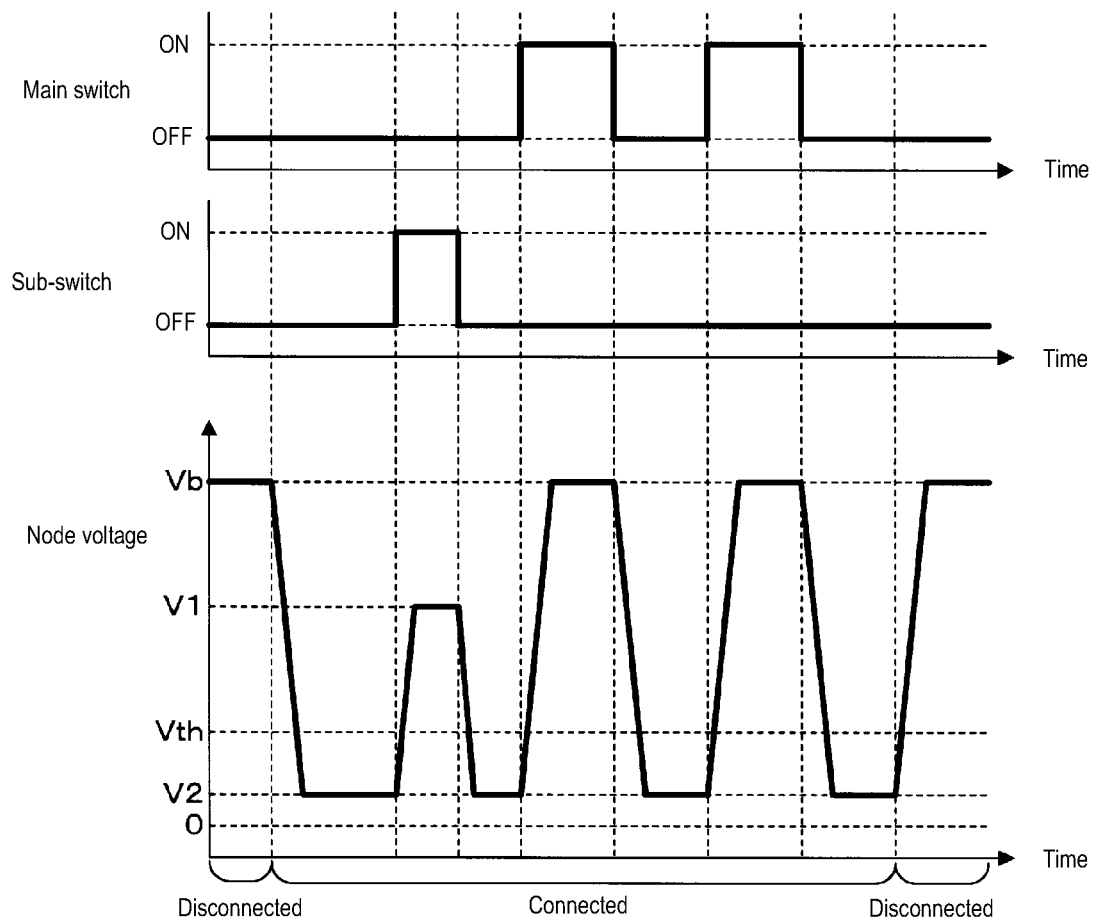
FIG. 2 is a timing chart showing an operation example of a switch device.

FIG. 2 is a timing chart showing an operation example of the switch device 10. The transition of the states of the main switch 20 and the sub-switch 40 and the transition of the node voltage are shown in FIG. 2. Regarding these transitions, time is shown on the horizontal axis. In FIG. 2, Vb denotes the power supply voltage. V1 denotes a first divided voltage obtained by the switch circuit 26 and the load 12 dividing the power supply voltage Vb when the sub-switch 40 is ON. V2 denotes a second divided voltage obtained by the circuit resistor 29 and the load 12 dividing the power supply voltage Vb. An operation example of the switch device 10 when the power supply voltage Vb is stable is shown in FIG. 2.

As aforementioned, the resistance value of the circuit resistor 29 is sufficiently higher than the ON resistance value of the sub-switch 40. The second divided voltage V2 is thus sufficiently lower than the first divided voltage V1. Vth is a voltage threshold value for determining whether the load connector Tb is connected to the device connector Ta. The voltage threshold value Vth is less than the power supply voltage Vb and exceeds the second divided voltage V2.

The resistance component value of the load 12 is sufficiently lower than the resistance value of the circuit resistor 29. The load 12 is assumed to be a load whose resistance component value is no more than a few kiloohms, for example. The resistance value of the circuit resistor 29 is a few megaohms, for example, as aforementioned. The second divided voltage V2 is thus a value close to 0 V.

When the load 12 is not connected to the device connector Ta in the case where the main switch 20 and the sub-switch 40 are OFF, current flows from the positive electrode of the DC power source 11 in order of the circuit resistor 29 and the capacitor 30. The capacitor 30 is thereby charged until the node voltage, that is, the end-to-end voltage of the capacitor 30, equals the power supply voltage Vb. Accordingly, when the load 12 is not connected to the device connector Ta, the node voltage detected by the voltage detection unit 31 substantively matches the power supply voltage Vb and is greater than or equal to the voltage threshold value Vth. The MC 23 determines that the device connector Ta is not connected to the load connector Tb, when the node voltage is greater than or equal to the voltage threshold value Vth in the case where the main switch 20 and the sub-switch 40 are OFF.

The capacitor 30 has a small capacitance. The node voltage thus increases at a fast rate, when the capacitor 30 is being charged. The node voltage also decreases at a fast rate, when the capacitor 30 is discharging.

When the load 12 is connected to the device connector Ta in the case where the main switch 20 and the sub-switch 40 are OFF, the capacitor 30 discharges via the load 12 until the node voltage equals the second divided voltage V2. When the load 12 is connected to the device connector Ta, the node voltage is less than the voltage threshold value Vth. The MC 23 determines that the load 12 is connected to the device connector Ta, when the node voltage is less than the voltage threshold value Vth in the case where the main switch 20 and the sub-switch 40 are OFF.

When the load 12 is connected to the device connector Ta in the case where the main switch 20 and the sub-switch 40 are OFF, current flows from the positive electrode of the DC power source 11 in order of the circuit resistor 29, the device connector Ta and the load 12. The current path of current that flows in order of the circuit resistor 29 and the device connector Ta corresponds to a third current path. The circuit resistor 29 is provided on the third current path.

As aforementioned, the resistance value of the circuit resistor 29 is sufficiently high. When the main switch 20 and the sub-switch 40 are OFF, the current that flows through the load 12 is thus low. The power that is supplied to the load 12 is thus less than the given power, and the load 12 will not operate.

The MC 23 turns ON the sub-switch 40, if it is determined that the load 12 is connected to the device connector Ta. At this time, current flows from the positive electrode of the DC power source 11 in order of the sub-switch 40, the device connector Ta and the load 12. The current path of current that flows from the positive electrode of the DC power source 11 in order of the sub-switch 40 and the device connector Ta corresponds to a second current path. The sub-switch 40, that is, the switch circuit 26, is provided on the second current path. The connection node located between the current output circuit 21 and the device connector Ta is a connection node located downstream of the main switch 20 and the sub-switch 40.

As aforementioned, the resistance value of the circuit resistor 29 is sufficiently higher than the ON resistance value of the sub-switch 40. When the sub-switch 40 is ON, the current that flows via the circuit resistor 29 is thus substantively 0 A. Also, since the resistance value of the switch circuit 26 when the sub-switch 40 is ON, that is, the ON resistance value of the sub-switch 40, is high, the current that flows through the load 12 is small. Accordingly, the power that is supplied to the load 12 is less than the given power, and the load 12 will not operate.

Furthermore, because the resistance value of the switch circuit 26 when the sub-switch 40 is ON is high, the current that flows is small in the case where the load 12 having a resistance component value of 0 ohms is connected to the device connector Ta and the main switch 20 and the sub-switch 40 are respectively OFF and ON. This current is a normal value that does not cause smoke to be generated in the sub-switch 40, on the connection lines connecting the DC power source 11 and the sub-switch 40 and connecting the sub-switch 40 and the device connector Ta, or the like. The current that flows in the case where a load 12 having a resistance component value of 0 ohms is connected to the device connector Ta and the main switch 20 and the sub-switch 40 are respectively OFF and ON will not cause the temperature of the sub-switch 40 to increase to an abnormal level. The sub-switch 40 thus will not fail. Here, 0 ohms is a substantive value rather than an exact value.

When the sub-switch 40 turns ON in a state where the main switch 20 is OFF and the load 12 is connected to the device connector Ta, the DC power source 11 charges the capacitor 30 until the node voltage equals the first divided voltage V1. The MC 23 calculates the resistance component value of the load 12, based on the power supply voltage Vb detected by the power supply detection unit 22, and the node voltage detected by the voltage detection unit 31 in a state where the main switch 20 is OFF and the sub-switch 40 is ON, that is, the first divided voltage V1.

The resistance value of the switch circuit 26 when the sub-switch 40 is ON will be denoted as rs. The resistance component value of the load 12 will be denoted as rd. The first divided voltage V1 is represented by the following formula using the resistance value rs, the resistance component value rd, and the power supply voltage Vb.

$$V1 = Vb \cdot (rd/(rs+rd))$$

The resistance value rs of the switch circuit 26 is measured in advance and is a known value. The power supply voltage Vb and the first divided voltage V1 are respectively detected by the power supply detection unit 22 and the voltage detection unit 31. Accordingly, the resistance value rs of the switch circuit 26 can be calculated.

The MC 23 turns OFF the sub-switch 40, after acquiring node voltage information indicating the first divided voltage V1. The capacitor 30 thereby discharges until the node voltage equals the second divided voltage V2.

The MC 23 determines whether the switch current that flows when the main switch 20 turns ON, that is, Vb/rs, will be less than the current threshold value, based on the calculated resistance value rs of the switch circuit 26. If it is determined that the switch current will be greater than or equal to the current threshold value, the MC 23 outputs a notification signal indicating that power supply to the load 12 is not possible. If it is determined that the switch current will be less than the current threshold value, the MC 23 executes power supply control processing for controlling power supply to the load 12. In the power supply control processing, the MC 23 turns the main switch 20 ON or OFF based on the input signal. The sub-switch 40 is kept OFF while the power supply control processing being executed.

As aforementioned, when the main switch 20 is ON, power is supplied to the load 12 and the load 12 operates. Because the ON resistance value of the main switch 20 is sufficiently lower than the resistance value of the circuit resistor 29, the current that flows via the circuit resistor 29 when the main switch 20 is ON is substantively 0 A. When the main switch 20 is ON, the capacitor 30 is charged until the node voltage equals the power supply voltage Vb. When the main switch 20 is OFF, the capacitor 30 discharges until the node voltage equals the second divided voltage V2.

The MC 23 determines whether the load 12 is connected to the device connector Ta in cycles, while executing the power supply control processing. Because the node voltage is the power supply voltage Vb when the main switch 20 is OFF in the case where the load 12 is not connected, the MC 23 determines whether the node voltage is greater than or equal to the voltage threshold value Vth, as aforementioned.

When the load 12 is connected to the device connector Ta in the case where the sub-switch 40 is OFF and the main switch 20 is ON, the switch current flows. When the load 12 is not connected to the device connector Ta in the same case, the switch current does not flow, and the switch current indicated by the current information that is input to the MC 23 will be 0 A. When the main switch 20 is ON, the MC 23 determines whether the load 12 is connected to the device connector Ta, based on the input current information.

Configuration of MC 23

Figure 3:
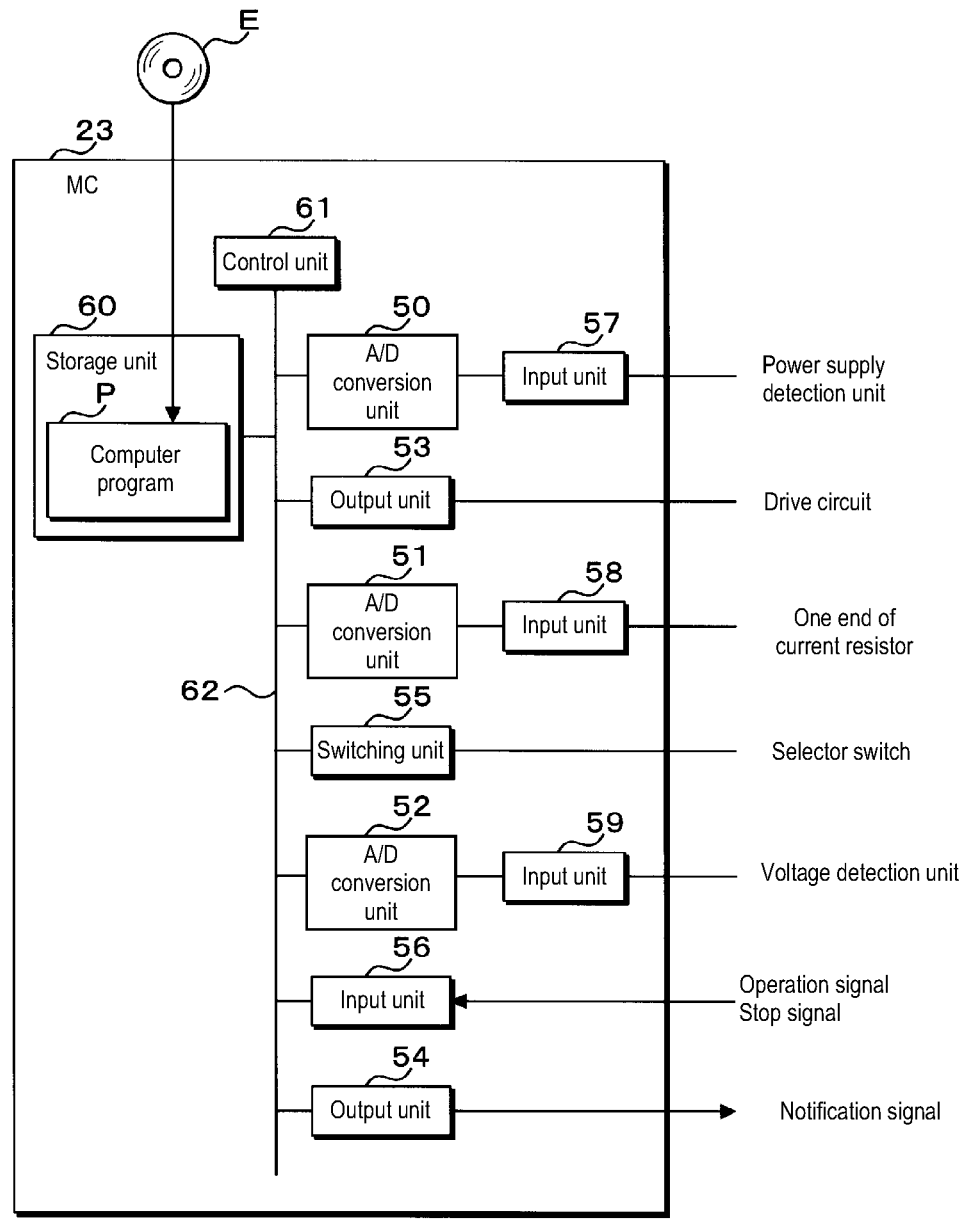
FIG. 3 is a block diagram showing the main configuration of a microcomputer.

FIG. 3 is a block diagram showing the main configuration of the MC 23. The MC 23 has A/D conversion units 50, 51 and 52, output units 53 and 54, a switching unit 55, input units 56, 57, 58 and 59, a storage unit 60 and a control unit 61. The A/D conversion units 50, 51 and 52, the output units 53 and 54, the switching unit 55, the input unit 56, the storage unit 60 and the control unit 61 are connected to an internal bus 62. The A/D conversion units 50, 51 and 52 are further respectively connected to the input units 57, 58 and 59. The inputs 57, 58 and 59 are respectively connected to the power supply detection unit 22, one end of the current resistor 25 and the voltage detection unit 31. The output unit 53 is further connected to the drive circuit 24. The switching unit 55 is connected to the base of the selector switch 27 via the switch resistor 28.

Analog power supply voltage information is input from the power supply detection unit 22 to the input unit 57. When the analog power supply voltage information is input, the input unit 57 outputs the input analog power supply voltage information to the A/D conversion unit 50. The A/D conversion unit 50 converts the analog power supply voltage information input from the input unit 57 into digital power supply voltage information. The control unit 61 acquires the digital power supply voltage information from the A/D conversion unit 50. The power supply voltage indicated by the power supply voltage information acquired by the control unit 61 substantively matches the power supply voltage detected by the power supply detection unit 22 at the time of acquisition.

The output unit 53 outputs ON and OFF instructions to the drive circuit 24 in accordance with instructions of the control unit 61. As aforementioned, the drive circuit 24 turns ON the main switch 20 when the ON instruction is input, and turns OFF the main switch 20 when the OFF instruction is input.

Analog current information is input from one end of the current resistor 25 to the input unit 58. When the analog current information is input, the input unit 58 outputs the input analog current information to the A/D conversion unit 51. The A/D conversion unit 51 converts the analog current information input from the input unit 58 into digital current information. The control unit 61 acquires the digital current information from the A/D conversion unit 51. The switch current indicated by the current information acquired by the control unit 61 substantively matches the switch current detected at the time of acquisition.

The control unit 61 instructs the switching unit 55 to turn the sub-switch 40 ON or OFF. When the control unit 61 instructs that the sub-switch 40 be turned ON, the switching unit 55 increases the voltage of the base of the selector switch 27 relative to the ground potential and turns ON the selector switch 27. As aforementioned, when the selector switch 27 turns ON, the sub-switch 40 turns ON. When the control unit 61 instructs that the sub-switch 40 be turned OFF, the switching unit 55 reduces the voltage of the base of the selector switch 27 relative to the ground potential and turns OFF the selector switch 27. As aforementioned, when the selector switch 27 turns OFF, the sub-switch 40 turns OFF.

Analog node voltage information is input from the voltage detection unit 31 to the input unit 59. When the analog node voltage information is input, the input unit 59 outputs the input analog node voltage information to the A/D conversion unit 52. The A/D conversion unit 52 converts the analog node voltage information input from the input unit 59 into digital node voltage information. The control unit 61 acquires the digital node voltage information from the A/D conversion unit 52. The node voltage indicated by the node voltage information acquired by the control unit 61 substantively matches the node voltage detected by the power supply detection unit 22 at the time of acquisition.

The operation signal and the stop signal are input to the input unit 56. When a signal is input, the input unit 56 notifies the input signal to the control unit 61.

The output unit 54 outputs notification signals in accordance with instructions of the control unit 61.

The storage unit 60 is a nonvolatile memory. A computer program P is stored in the storage unit 60. The control unit 61 has a processing element that executes processing, such as a CPU (Central Processing Unit), for example, and functions as a processing unit. The processing element (computer) of the control unit 61 executes connection detection processing, current determination processing and the aforementioned power supply control processing in parallel, by executing the computer program P. The connection detection processing is processing for detecting connection of the load 12 to the device connector Ta. The current determination processing is processing for determining whether the switch current that flows when the main switch 20 is turned ON will be less than the current threshold value.

Note that the computer program P may be stored in a storage medium E that is readable by the processing element provided in the control unit 61. In this case, the computer program P read out from the storage medium E by a reading device not shown is written to the storage unit 60. The storage medium E is an optical disk, a floppy disk, a magnetic disk, a magnetic optical disk, a semiconductor memory or the like. Examples of an optical disk include a CD-ROM (Compact Disc Read Only Memory), a DVD-ROM (Digital Versatile Disc ROM) and a BD (Blu-ray® Disc). An example of a magnetic disk is a hard disk. Also, the computer program P may be downloaded from an external device not shown that is connected to a communication network not shown, and the downloaded computer program P may be written to the storage unit 60.

Also, the number of processing elements provided in the control unit 61 is not limited to 1, and may be 2 or more. In this case, the plurality of processing elements may jointly perform the connection detection processing, current determination processing and power supply control processing, in accordance with the computer program P.

In addition to the computer program P, the values of a connection flag and a permission flag are stored in the storage unit 60. The values of the connection flag and the permission flag are 0 or 1. The value of the connection flag being 0 means that the load 12 is not connected to the device connector Ta. The value of the connection flag being 1 means that the load 12 is connected to the device connector Ta. The value of the permission flag being 0 means that turning ON the main switch 20 is prohibited. The value of the permission flag being 1 means that turning ON the main switch 20 is permitted.

Connection Detection Processing

Figure 4:
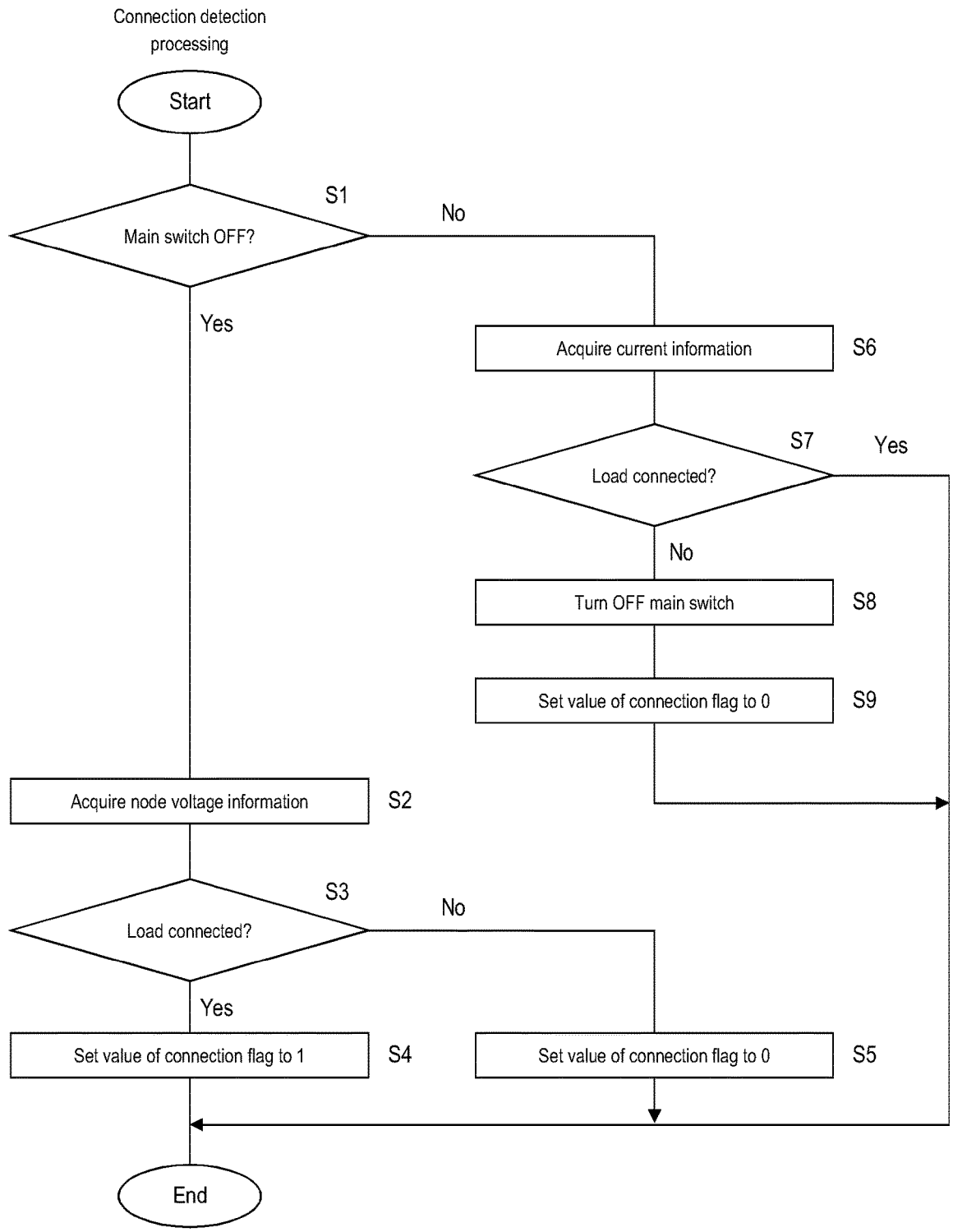
FIG. 4 is a flowchart showing the procedure of connection detection processing.

FIG. 4 is a flowchart showing the procedure of connection detection processing. The control unit 61 executes the connection detection processing in cycles when the sub-switch 40 is OFF. In the connection detection processing, the control unit 61 determines whether the main switch 20 is OFF (step 51). In step 51, the control unit 61 determines that the main switch 20 is OFF, when the latest instruction output by the output unit 53 is the OFF instruction. When the latest instruction output by the output unit 53 is the ON instruction, the control unit 61 determines that the main switch 20 is ON.

If it is determined that the main switch 20 is OFF (Si: YES), the control unit 61 acquires node voltage information from the A/D conversion unit 52 (step S2).

Next, the control unit 61 determines whether the load 12 is connected to the device connector Ta, based on the node voltage indicated by the node voltage information acquired in step S2 (step S3). As mentioned in the operation example of the switch device 10, in step S3, the control unit 61 determines that the load 12 is not connected, when the node voltage is greater than or equal to the voltage threshold value. The control unit 61 determines that the load 12 is connected, when the node voltage is less than the voltage threshold value.

If it is determined that the load 12 is connected (S3: YES), the control unit 61 sets the value of the connection flag to 1 (step S4), and ends the connection detection processing. When the value of the connection flag is 1 at the time that it is determined that the load 12 is connected, the control unit 61 omits execution of step S4 and ends the connection detection processing.

If it is determined that the load 12 is not connected (S3: NO), the control unit 61 sets the value of the connection flag to 0 (step S5), and ends the connection detection processing. When the value of the connection flag is 0 at the time that it is determined that the load 12 is not connected, the control unit 61 omits execution of step S5 and ends the connection detection processing.

If it is determined that the main switch 20 is not OFF, that is, that the main switch 20 is ON (S1: NO), the control unit 61 acquires current information from the A/D conversion unit 51 (step S6). Next, the control unit 61 determines whether the load 12 is connected to the device connector Ta, based on the switch current indicated by the current information acquired in step S6 (step S7). As mentioned in the operation example of the switch device 10, in step S7, the control unit 61 determines that the load 12 is connected, when the switch current exceeds 0 A. When the switch current is 0 A, the control unit 61 determines that the load 12 is not connected.

As long as the value of the connection flag is not 1, the output unit 53 will not output the ON instruction to the drive circuit 24. Accordingly, the drive circuit 24 turns ON the main switch 20 in a state where the value of the connection flag is 1. When the main switch 20 is ON, the value of the connection flag is 1. At the time that step S7 is executed, the value of the connection flag is 1.

If it is determined that the load 12 is not connected (S7: NO), the control unit 61 instructs the output unit 53 to turn OFF the main switch 20 (step S8). The output unit 53 turns OFF the main switch 20 by outputting the OFF instruction to the drive circuit 24. After executing step S8, the control unit 61 sets the value of the connection flag to 0 (step S9). If it is determined that the load 12 is connected (S7: YES), or after executing step S9, the control unit 61 ends the connection detection processing.

As described above, in the connection detection processing, the control unit 61 detects connection of the load 12 based on the node voltage, when the main switch 20 is OFF, and detects connection of the load 12 based on the switch current, when the main switch 20 is ON. When the load 12 is not connected despite the main switch 20 being ON, the drive circuit 24 turns OFF the main switch 20, and the control unit 61 sets the value of the connection flag to 0. The switch device 10 will be in a state where the load 12 is not connected despite the main switch 20 being ON, when the load 12 is disconnected from the device connector Ta while the load 12 is operating.

Current Determination Processing

Figure 5:
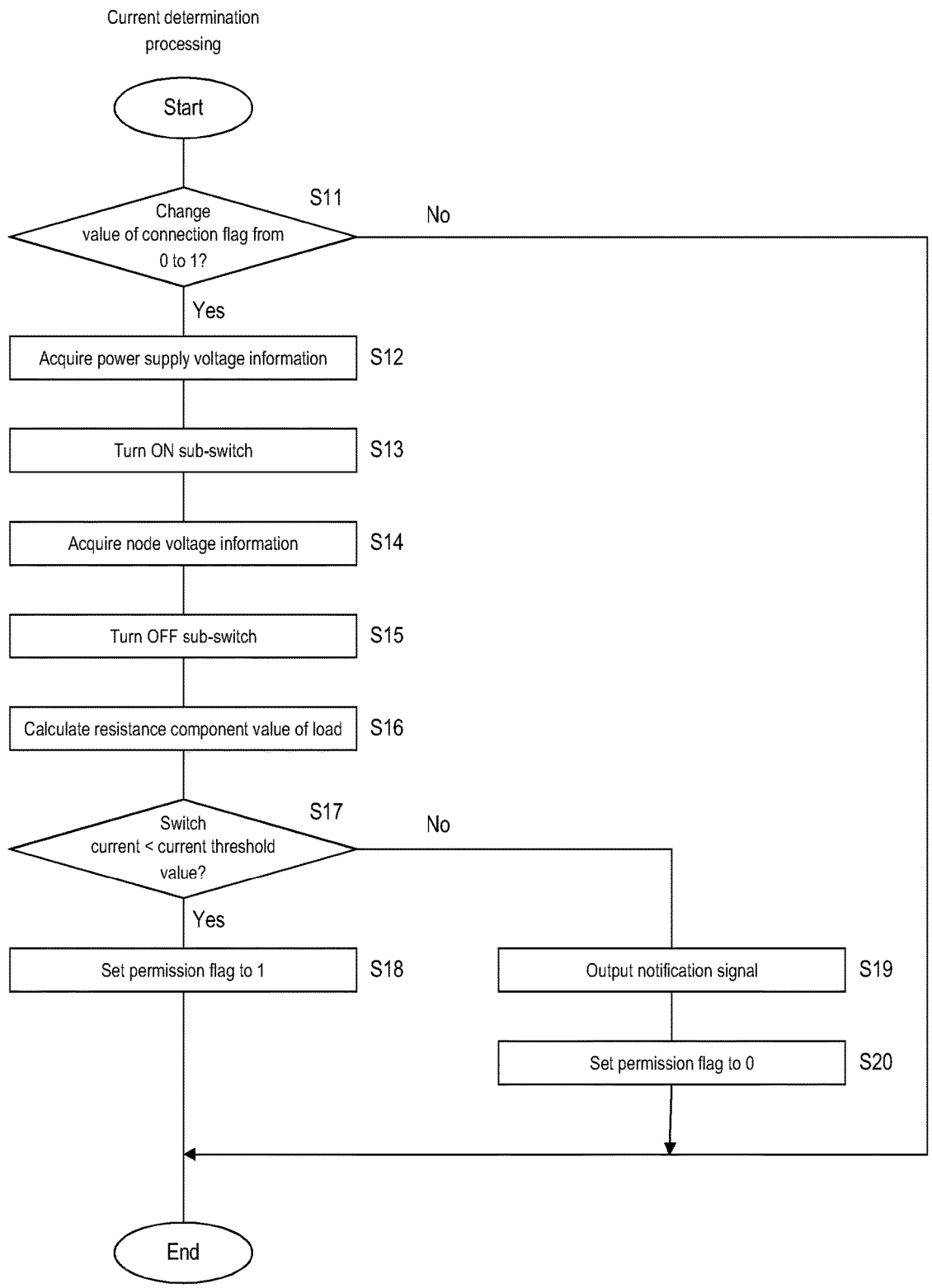
FIG. 5 is a flowchart showing the procedure of current determination processing.

FIG. 5 is a flowchart showing the procedure of current determination processing. The control unit 61 executes the current determination processing in cycles when the main switch 20 is OFF. In the current determination processing, first, the control unit 61 determines whether the value of the connection flag has changed from 0 to 1, that is, whether the load 12 is connected to the device connector Ta (step S11). In step S11, the control unit 61 determines that the value of the connection flag has changed from 0 to 1, when the value of the connection flag has changed from 0 at the time that the previous current determination processing was started to 1.

If it is determined that the value of the connection flag has not changed from 0 to 1 (S11: NO), the control unit 61 ends the current determination processing.

When the next cycle arrives, the control unit 61 executes the current determination processing again. Accordingly, if it is determined that the value of the connection flag has not changed from 0 to 1, the control unit 61 waits until the value of the connection flag changes from 0 to 1.

If it is determined that the value of the connection flag has changed from 0 to 1, that is, that the load 12 is connected to the device connector Ta (S11: YES), the control unit 61 acquires power supply voltage information from the A/D conversion unit 50 (step S12). Next, the control unit 61 instructs the switching unit 55 to turn ON the sub-switch 40 (step S13). As aforementioned, the switching unit 55 turns ON the sub-switch 40 by turning ON the selector switch 27. When the sub-switch 40 turns ON, the capacitor 30 is charged until the node voltage equals the first divided voltage.

After executing step S13, the control unit 61 acquires node voltage information from the A/D conversion unit 52 (step S14). The period from when execution of step S13 ends until when execution of step S14 starts is longer than the period from when the sub-switch 40 turns ON until when charging of the capacitor 30 is completed. Accordingly, the node voltage indicated by the node voltage information acquired by the control unit 61 in step S14 is the first divided voltage.

After executing step S14, the control unit 61 instructs the switching unit 55 to turn OFF the sub-switch 40 (step S15).

As aforementioned, the switching unit 55 turns OFF the sub-switch 40 by turning OFF the selector switch 27. When the sub-switch 40 turns OFF, the capacitor 30 discharges and the node voltage decreases to the second divided voltage.

After executing step S15, the control unit 61 calculates the resistance component value of the load 12, based on the node voltage indicated by the node voltage information acquired in step S14, that is, the first divided voltage (step S16). Next, the control unit 61 determines whether the switch current that flows when the main switch 20 turns ON will be less than the current threshold value, based on the resistance component value calculated in step S16 (step S17).

As a first example of step S17, the control unit 61 calculates the switch current based on the power supply voltage indicated by the power supply voltage information acquired in step S12 and the resistance component value calculated in step S16. The control unit 61 determines whether the calculated switch voltage is less than the current threshold value.

The switch current that flows when the main switch 20 turns ON is smaller, the higher is the resistance component value of the load 12. Accordingly, as a second example of step S17, the control unit 61 determines that the switch current will be less than the current threshold value, when the resistance component value calculated in step S16 is greater than or equal to the resistance threshold value. The control unit 61 determines that the switch current will be greater than or equal to the current threshold value, when the resistance component value calculated in step S16 is less than the resistance threshold value. The resistance threshold value is a given value and is set in advance.

If it is determined that the switch current will be less than the current threshold value (S17: YES), the control unit 61 sets the value of the permission flag to 1 (step S18), and ends the current determination processing. If it is determined that the switch current will be greater than or equal to the current threshold value (S17: NO), the control unit 61 instructs the output unit 54 to output a notification signal indicating that power supply to the load 12 is not possible (step S19). Next, the control unit 61 sets the value of the permission flag to 0 (step S20) and ends the current determination processing.

As described above, in the current determination processing, when the load 12 is connected to the device connector Ta, the control unit 61 calculates the resistance component value of the load 12, and determines whether the switch current will be less than the current threshold value based on the calculated resistance component value. If it is determined that the switch current will be less than the current threshold value, the control unit 61 sets the value of the permission flag to 1 and permits the main switch 20 to be turned ON.

Power Supply Control Processing

Figure 6:
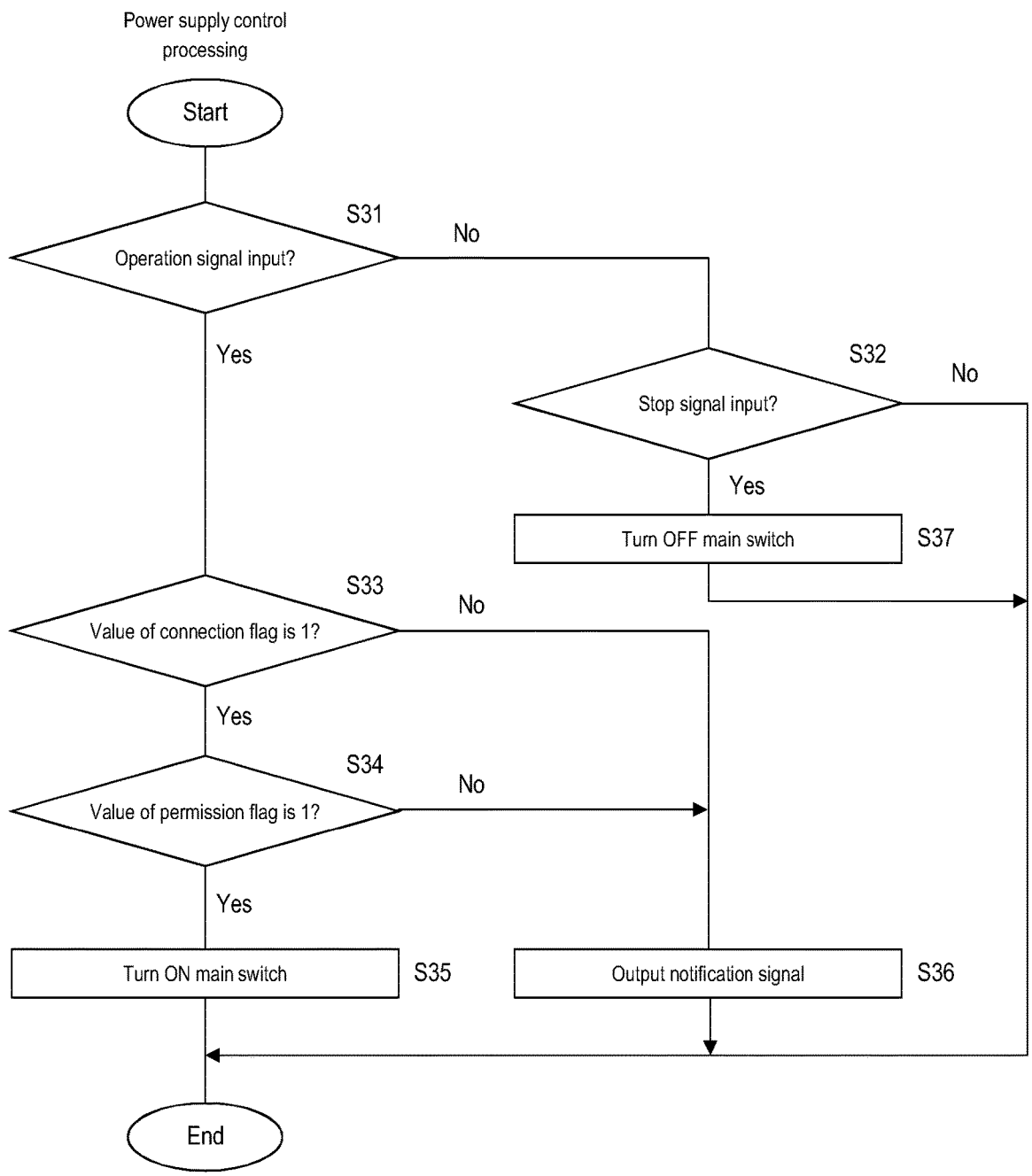
FIG. 6 is a flowchart showing the procedure of power supply control processing.

FIG. 6 is a flowchart showing the procedure of power supply control processing. The control unit 61 executes the power supply control processing in cycles when the sub-switch 40 is OFF. In the power supply control processing, first, the control unit 61 determines whether the operation signal has been input to the input unit 56 (step S31). If it is determined that the operation signal has not been input (S31: NO), the control unit 61 determines whether the stop signal has been input to the input unit 56 (step S32). If it is determined that the stop signal has not been input (S32: NO), the control unit 61 ends the power supply control processing. When the next cycle arrives, the control unit 61 executes the power supply control processing again. Accordingly, when the operation signal or the stop signal has not been input to the input unit 56, the control unit 61 waits until the operation signal or the stop signal is input to the input unit 56.

If it is determined that the operation signal has been input (S31: YES), the control unit 61 determines whether the value of the connection flag is 1 (step S33). If it is determined that the value of the connection flag is 1 (S33: YES), the control unit 61 determines whether the value of the permission flag is 1 (step S34).

If it is determined that the value of the permission flag is 1 (S34: YES), the control unit 61 instructs the output unit 53 to turn ON the main switch 20 (step S35). The output unit 53 turns ON the main switch 20 by outputting the ON instruction to the drive circuit 24. The load 12 thereby operates.

If it is determined that the value of the connection flag is not 1 (S33: NO), or if it is determined that the value of the permission flag is not 1 (S34: NO), the control unit 61 instructs the output unit 54 to output a notification signal (step S36). When the value of the connection flag is not 1, the output unit 54 outputs a notification signal indicating that the load 12 is disconnected. When the value of the permission flag is not 1, the output unit 54 outputs a notification signal indicating that power supply to the load 12 is not possible. When one of steps S35 and S36 is executed, the control unit 61 ends the power supply control processing.

If it is determined that the stop signal has been input (S32: YES), the control unit 61 instructs the output unit 53 to turn OFF the main switch 20 (step S37). As aforementioned, the output unit 53 turns OFF the main switch 20 by outputting the OFF instruction to the drive circuit 24. The load 12 thereby stops operating. After executing step S37, the control unit 61 ends the power supply control processing.

As described above, in the power supply control processing, when the value of the permission flag is 1 in the case where the operation signal has been input, the control unit 61 instructs the output unit 53 to turn ON the main switch 20. When the value of the permission flag is 0, the control unit 61 will not instruct the output unit 53 to turn ON the main switch 20. Flow of an overcurrent exceeding the current threshold value is thus prevented. When the stop signal is input, the control unit 61 instructs the output unit 53 to turn OFF the main switch 20.

Second Embodiment

In order to realize a switch device 10 having low power consumption in the first embodiment, a processing element that halts operation may be used as the processing element provided in the control unit 61.

Hereinafter, a second embodiment will be described focusing on the differences from the first embodiment. Configuration other than the configuration that will be described below is common to the first embodiment. Constituent units common to the first embodiment will thus be given the same reference numerals as the first embodiment and description thereof will be omitted.

Configuration of MC 23

Figure 7:
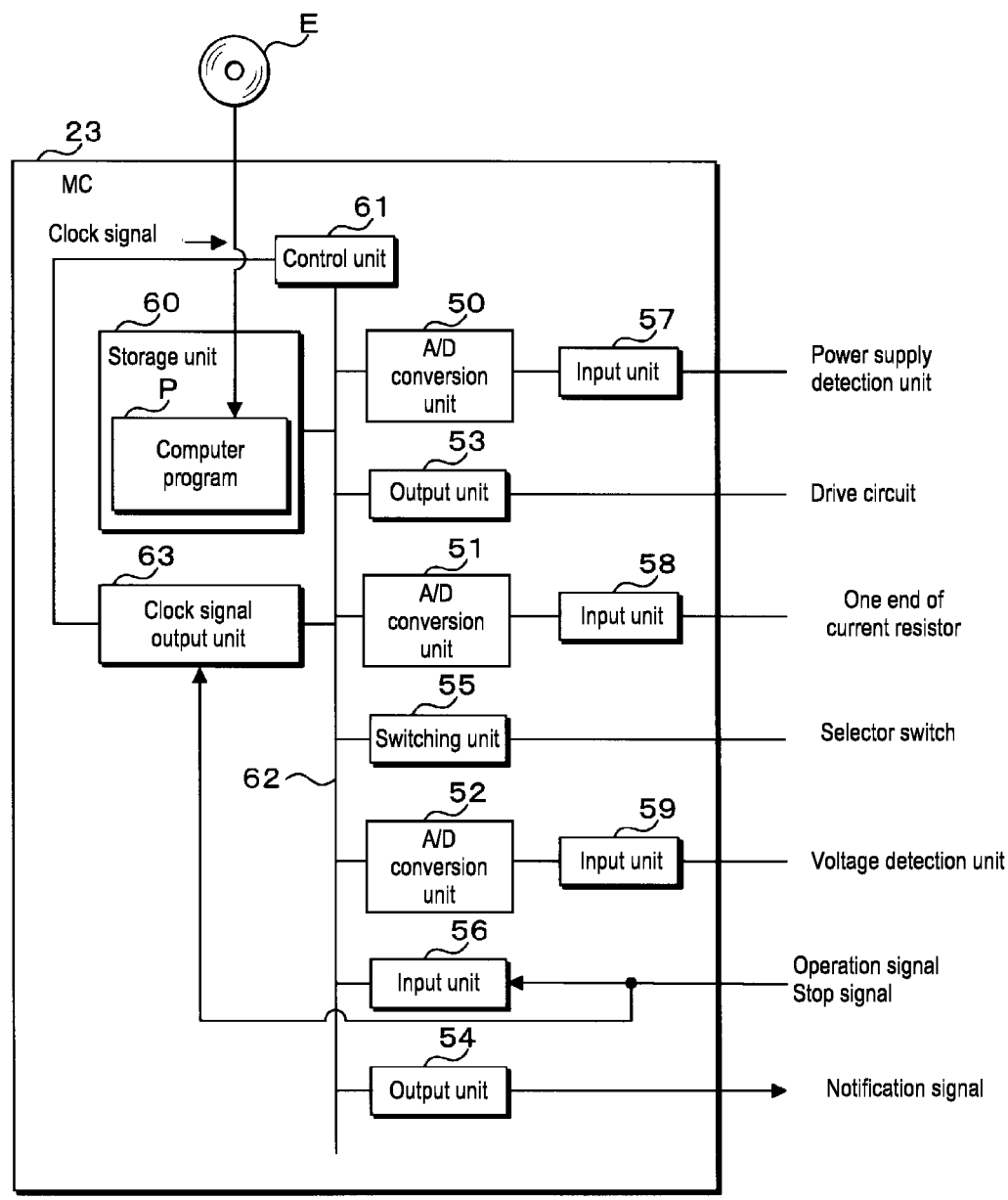
FIG. 7 is a block diagram showing the main configuration of a microcomputer in a second embodiment.

FIG. 7 is a block diagram showing the main configuration of an MC 23 in the second embodiment. The configuration of the MC 23 in the second embodiment differs in comparison with the first embodiment. The MC 23 in the second embodiment has a clock signal output unit 63, in addition to the constituent units of the MC 23 in the first embodiment. The clock signal output unit 63 is directly connected to the control unit 61 together with being connected to the internal bus 62.

The clock signal output unit 63 outputs a clock signal to the control unit 61. The clock signal is constituted by a high-level voltage and a low-level voltage. The voltage indicated by the clock signal switches from the low-level voltage to the high-level voltage in cycles. The processing element of the control unit 61 executes one iteration of processing, every time the voltage switches from the low-level voltage to the high-level voltage in the clock signal.

The control unit 61 causes the clock signal output unit 63 to stop output of the clock signal, via the internal bus 62. When the clock signal output unit 63 has stopped output of the clock signal, the processing element of the control unit 61 halts operation.

The operation signal and the stop signal are input not only to the input unit 56 but also to the clock signal output unit 63. The clock signal output unit 63 resumes output of the clock signal to the control unit 61, when the operation signal or the stop signal is input in a state where output of the clock signal is stopped. The processing element of the control unit 61 thereby resumes operation.

The processing element of the control unit 61 executes not only connection detection processing, current determination processing and power supply control processing but also halt processing and startup processing, by executing the computer program P. The halt processing is processing for stopping output of the clock signal. The startup processing is the processing that is initially executed when the control unit 61 resumes operation.

Halt Processing

Figure 8:
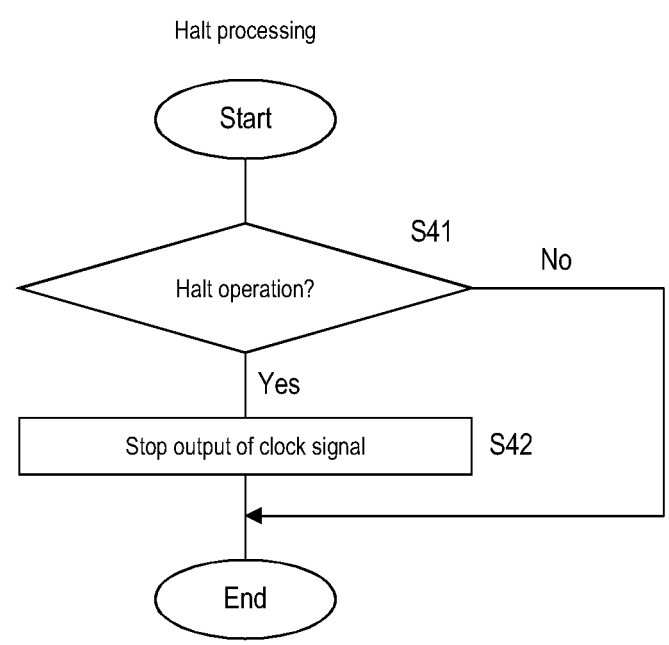
FIG. 8 is a flowchart showing the procedure of halt processing.

FIG. 8 is a flowchart showing the procedure of halt processing. The control unit 61 executes the halt processing in cycles. In the halt processing, the control unit 61 determines whether to halt operation (step S41). In step S41, the control unit 61 determines to halt operation when an OFF period in which the main switch 20 and the sub-switch 40 are OFF is greater than or equal to a reference period. The control unit 61 determines not to halt operation if the OFF period is less than the reference period.

If it is determined not to halt operation (S41: NO), the control unit 61 ends the halt processing. When the next cycle arrives, the control unit 61 executes the halt processing again. Accordingly, if it is determined not to halt operation, the control unit 61 waits until the OFF period is greater than or equal to the reference period.

If it is determined to halt operation (S41: YES), the control unit 61 instructs the clock signal output unit 63 to stop output of the clock signal to the control unit 61 (step S42), and ends the halt processing. As aforementioned, when output of the clock signal stops, the control unit 61 halts operation. When the operation signal or the stop signal is input to the clock signal output unit 63 after the control unit 61 stops operation, the clock signal output unit 63 resumes output of the clock signal, and the control unit 61 resumes operation.

Startup Processing

Figure 9:
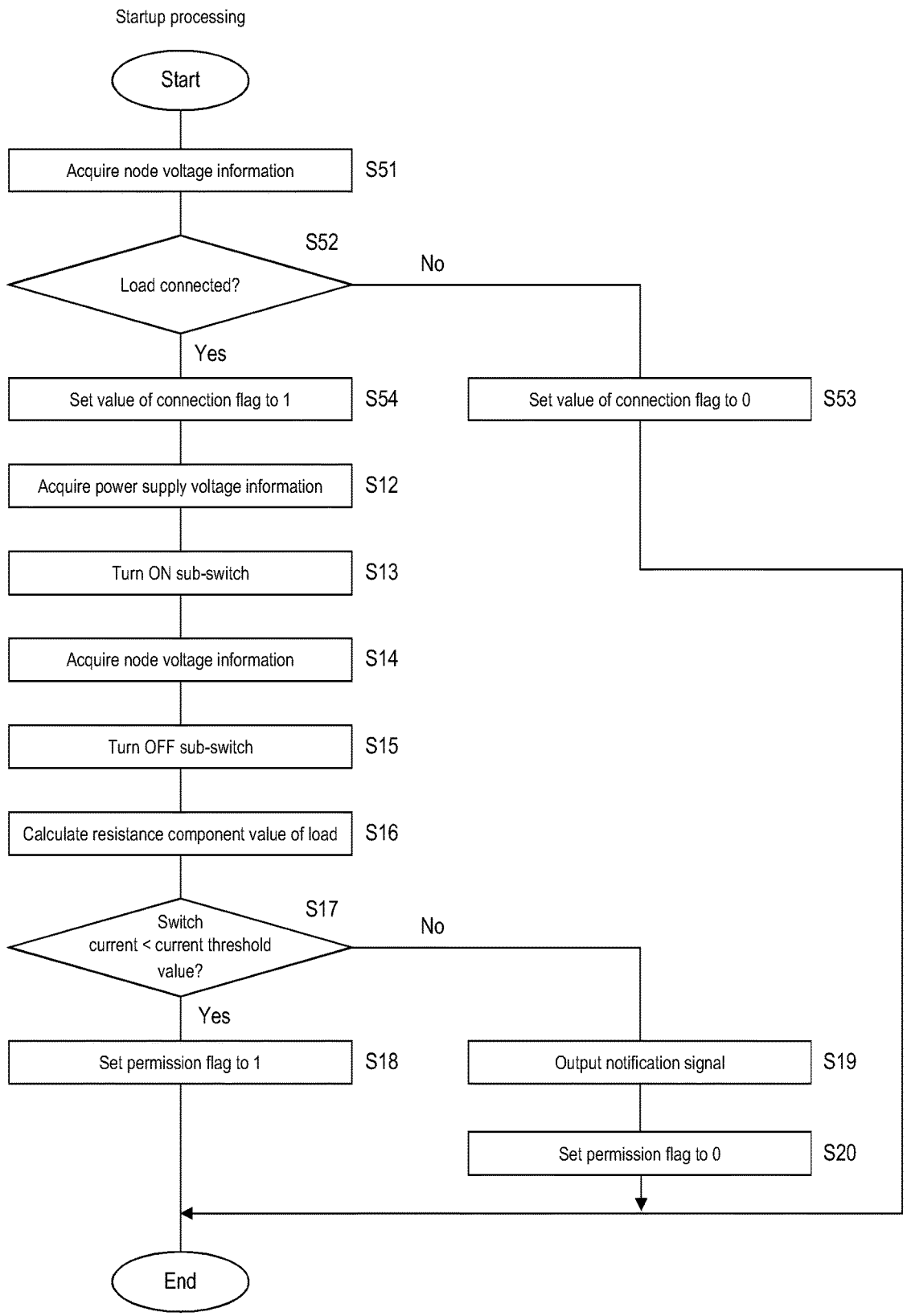
FIG. 9 is a flowchart showing the procedure of startup processing.

FIG. 9 is a flowchart showing the procedure of startup processing. The control unit 61 executes startup processing when operation is resumed, that is, when output of the clock signal is resumed. Because the control unit 61 halts operation in a state where the main switch 20 and the sub-switch 40 are OFF, the startup processing is executed in a state where the main switch 20 and the sub-switch 40 are OFF. The startup processing is similar to part of the current determination processing. Description of the processing that is similar to part of the current determination processing, that is, steps S12 to S20, will be omitted.

In the startup processing, first, the control unit 61 acquires node voltage information from the A/D conversion unit 52 (step S51). Next, the control unit 61 determines whether the load 12 is connected to the device connector Ta, similarly to step S3 of the connection detection processing, based on the node voltage indicated by the node voltage information acquired in step S51 (step S52).

If it is determined that the load 12 is not connected (S52: NO), the control unit 61 sets the value of the connection flag to 0 (step S53), and ends the startup processing. If it is determined that the load 12 is connected (S52: YES), the control unit 61 sets the value of the connection flag to 1 (step S54). After executing steps S54, the control unit 61 sequentially executes steps S12 to S16, and calculates the resistance component value of the load 12. The control unit 61 determines whether the switch current that flows when the main switch 20 turns ON will be less than the current threshold value, based on the calculated resistance component value. The control unit 61 sets the value of the permission flag to 0 or 1 according to the determination result.

After executing one of steps S18 and S20, the control unit 61 ends the startup processing. After ending the startup processing, the control unit 61 executes the connection detection processing, current determination processing, power supply control processing and halt processing.

As described above, in the startup processing, the control unit 61 determines whether the load 12 is connected to the device connector Ta. If it is determined that the load 12 is connected, the control unit 61 calculates the resistance component value of the load 12, and determines whether the switch current that flows when the main switch 20 turns ON will be less than the current threshold value, based on the calculated resistance component value. Accordingly, the control unit 61 will not mistakenly instruct the output unit 53 to turn ON the main switch 20, in the case where the electrical device connected to the device connector Ta is changed to an electrical device having a low resistance component value as the load 12, while the control unit 61 is halting operation.

The switch device 10 in the second embodiment similarly achieves the effects achieved by the switch device 10 in the first embodiment.

Notes

In the case where there is little variation in the power supply voltage of the DC power source 11, the control unit 61 may omit step S12 in the current determination processing of the first and second embodiments. In this case, in step S16, the control unit 61 uses a value that is set in advance as the power supply voltage.

In step S17 of the current determination processing in the first and second embodiments, the control unit 61 determines whether the switch current will be less than the current threshold value, based on the resistance component value calculated in step S16. However, in step S17, the control unit 61 may directly determine whether the switch current will be less than the current threshold value, based on the node voltage indicated by the node voltage information acquired in step S14, that is, the first divided voltage. As aforementioned, the switch current that flows when the main switch 20 is turned ON is larger, the lower is the resistance component value of the load 12. The resistance component value of the load 12 is lower, the lower is the first divided voltage. Accordingly, the switch current is larger, the lower is the first divided voltage.

Accordingly, in step S17, the control unit 61 determines that the switch current will be greater than or equal to the current threshold value, when the node voltage indicated by the node voltage information acquired in step S14 is less than the reference voltage. The control unit 61 determines that the switch current will be less than the current threshold value, when the node voltage indicated by the node voltage information acquired in step S14 is greater than or equal to the reference voltage. The first divided voltage is proportional to the power supply voltage of the DC power source 11. The reference voltage that is used in step S17 is thus changed according to the power supply voltage indicated by the power supply voltage information acquired in step S12.

A higher reference voltage is used, the higher is the power supply voltage. In the case where there is little variation in the power supply voltage of the DC power source 11, the control unit 61 does not need to change the reference voltage. In this case, the control unit 61 may omit step S12 in the current determination processing. Furthermore, the switch device 10 does not need to have the power supply detection unit 22, and the MC 23 does not need to have the A/D conversion unit 50 and the input unit 57.

In the case where there is little variation in the power supply voltage of the DC power source 11, the control unit 61 may omit execution of step S12 in the startup processing of the second embodiment, similarly to the current determination processing. Also, in step S17 of the startup processing, the control unit 61 may directly determine whether the switch current will be less than the current threshold value, based on the node voltage indicated by the node voltage information acquired in step S14, that is, the first divided voltage, similarly to step S17 of the current determination processing.

In the second embodiment, the method by which the control unit 61 halts operation is not limited to a method that involves stopping output of the clock signal.

Generally, the cycle of the clock signal that the clock signal output unit 63 outputs to the control unit 61, that is, the interval between switching from the low-level voltage to the high-level voltage, is described as a first cycle. The control unit 61 may halt operation, by instructing the clock signal output unit 63 to change the cycle of the clock signal that is output to the control unit 61 from the first cycle to a second cycle that is longer than the first cycle.

In this configuration, the operation signal and the stop signal are not input to the clock signal output unit 63. The control unit 61 determines whether the operation signal or the stop signal has been input to the input unit 56, every time the voltage of the clock signal switches from the low-level voltage to the high-level voltage while the cycle of the clock signal is the second cycle. If it is determined that the operation signal or the stop signal has been input to the input unit 56, the control unit 61 instructs the clock signal output unit 63 to change the cycle of the clock signal to the first cycle, and executes the startup processing.

The clock signal is not limited to a signal whose voltage switches from a low-level voltage to a high-level voltage in cycles, and may be a signal whose voltage switches from a high-level voltage to a low-level voltage in cycles. In this case, the processing element of the control unit 61 executes processing, every time the voltage switches from the high-level voltage to the low-level voltage in the clock signal.

Third Embodiment

In the first embodiment, the sub-switch 40 of the switch circuit 26 is not limited to being a P-channel FET.

Hereinafter, a third embodiment will be described focusing on the differences from the first embodiment. Configuration other than the configuration that will be described below is common to the first embodiment. Constituent units common to the first embodiment will thus be given the same reference numerals as the first embodiment and description thereof will be omitted.

Configuration of Switch Device 10

Figure 10:
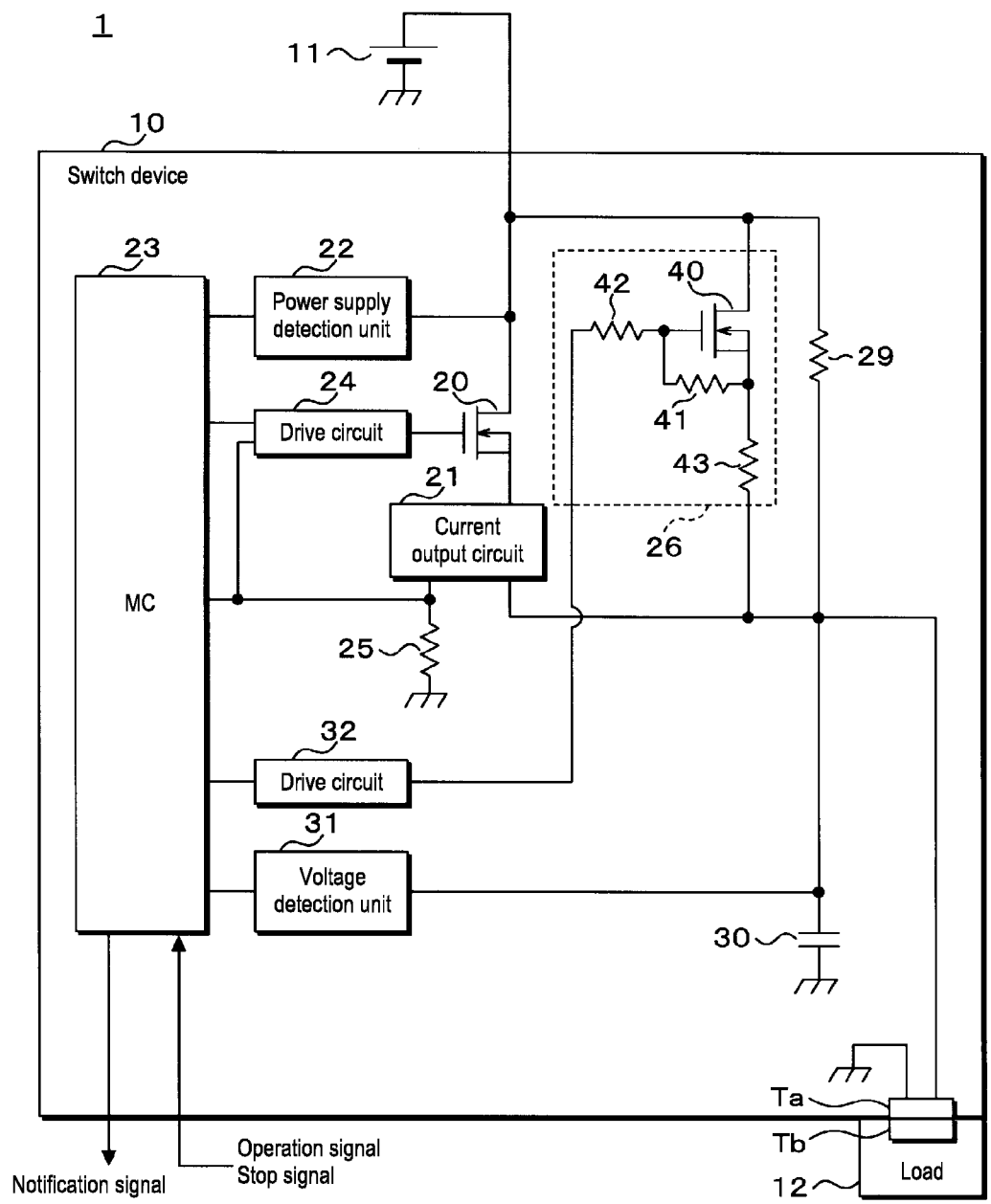
FIG. 10 is a block diagram showing the main configuration of a switch device in a third embodiment.

FIG. 10 is a block diagram showing the main configuration of a switch device 10 in the third embodiment. The switch device 10 in the third embodiment similarly has the constituent units of the switch device 10 in the first embodiment, except for the selector switch 27 and the switch resistor 28. The switch device 10 in the third embodiment further has a drive circuit 32. The switch circuit 26 in the third embodiment has a series resistor 43, in addition to the constituent units of the switch circuit 26 in the first embodiment. The sub-switch 40 in the third embodiment is an N-channel FET.

The drain of the sub-switch 40 of the switch circuit 26 is connected to the drain of the main switch 20. The source of the sub-switch 40 is connected to one end of the series resistor 43. The series resistor 43 functions as a second resistor. The other end of the series resistor 43 is connected to a connection node located between the current output circuit 21 and the device connector Ta. The switch resistor 41 is connected between the gate and source of the sub-switch 40. The gate of the sub-switch 40 is further connected to one end of the switch resistor 42. The other end of the switch resistor 42 is connected to the drive circuit 32. The drive circuit 32 is further connected to the switching unit 55 of the MC 23.

In the sub-switch 40, the resistance value between the drain and the source is sufficiently low, when the gate to source voltage is greater than or equal to a given voltage. At this time, the sub-switch 40 is ON and current can flow via the drain and the source. In the sub-switch 40, the resistance value between the drain and the source is sufficiently high, when the gate to source voltage is less than the given voltage. At this time, the sub-switch 40 is OFF and current will not flow via the drain and the source.

In the MC 23, the switching unit 55 outputs a second ON instruction for instructing that the sub-switch 40 be turned ON, when the control unit 61 instructs the switching unit 55 to turn ON the sub-switch 40. When the second ON instruction is input, the drive circuit 32 increases the voltage of the gate of the sub-switch 40 relative to the ground potential. In the sub-switch 40, the gate to source voltage thereby increases to greater than or equal to the given voltage, and the sub-switch 40 turns ON.

In the MC 23, the switching unit 55 outputs a second OFF instruction for instructing that the sub-switch 40 be turned OFF, when the control unit 61 instructs the switching unit 55 to turn OFF the sub-switch 40. When the second OFF instruction is input, the drive circuit 32 reduces the voltage of the gate of the sub-switch 40 relative to the ground potential. In the sub-switch 40, the gate to source voltage thereby decreases to less than the given voltage, and the sub-switch 40 turns OFF.

As mentioned in the description of the first embodiment, the ON resistance value of an N-channel FET is generally low at a few ohms. In the third embodiment, the series resistor 43 is connected in series to the sub-switch 40, in order to realize a circuit having a high resistance value when the sub-switch 40 is ON as the switch circuit 26. For example, in the case where the resistance value of the series resistor 43 is a few hundred ohms, the resistance value of the switch circuit 26 when the sub-switch 40 is ON will be a few hundred ohms.

In the third embodiment, the resistance value of the switch circuit 26 when the sub-switch 40 is ON is greater than the ON resistance value of the main switch 20, similarly to the first embodiment. The resistance value of the circuit resistor is greater than the resistance value of the switch circuit 26 when the sub-switch 40 is ON. Also, the current that flows when a load 12 having a resistance component value of 0 ohms is connected to the device connector Ta and the main switch 20 and the sub-switch 40 are respectively OFF and ON is a normal value that does not cause smoke to be generated.

The switch device 10 in the third embodiment similarly achieves the effects achieved by the switch device 10 in the first embodiment.

Notes

The ON resistance value of a relay contact is less than the ON resistance value of an N-channel FET. A relay contact may thus be used as the sub-switch 40 in the third embodiment. In this case, a configuration for turning the sub-switch 40 ON or OFF is provided in the switch device 10. The sub-switch 40 is turned ON or OFF by the switching unit 55. In the third embodiment, the source of the sub-switch 40 may be connected to a connection node located between the current output circuit 21 and the device connector Ta, in the case where the ON resistance value of the sub-switch 40 is high.

In the first and second embodiments, one end of the series resistor 43 may be connected in series to the drain of the sub-switch 40, in the case where the ON resistance value of the sub-switch 40 is low. In this case, the other end of the series resistor 43 is connected to a connection node located between the current output circuit 21 and the device connector Ta.

The switch device 10 in the second embodiment may be constituted similarly to the switch device 10 in the third embodiment.

In the first to third embodiments, the sub-switch 40 is not limited to being a FET or a relay contact, and may be a switch such as a bipolar transistor or an IGBT (Insulated Gate Bipolar Transistor). The configuration for detecting the switch current is not limited to a configuration that outputs a current obtained by dividing the switch current by a predetermined number to the current resistor 25, and may be constituted using a shunt resistor or a current sensor. The shunt resistor is connected in series to the source of the main switch 20, and the switch current is detected based on the end-to-end voltage of the shunt resistor. The current sensor detects the switch current based on the strength of the magnetic field that is generated when the switch current flows through the connection line that is connected to the source of the main switch 20.

The disclosed first to third embodiments are considered in all respects to be illustrative and not restrictive. The scope of the invention is indicated by the claims rather than by the foregoing content, and all changes that come within the meaning and range of equivalency of the claims are intended to be embraced therein.

The invention claimed is:

1. A switch device comprising:
a connector detachably connected to a load;
a main switch provided on a first current path from a DC power source to the connector;
a switch circuit provided on a second current path from the DC power source to the connector and including a sub-switch;
a resistor provided on a third current path from the DC power source to the connector and connected at one end to a connection node; and
a capacitor connected at one end to the connection node; and
a processing unit configured to execute processing,
wherein a resistance value of the switch circuit when the sub-switch is ON is greater than an ON resistance value of the main switch, and
the processing unit executes processing for
acquiring node voltage information indicating a node voltage of the connection node located downstream of the main switch and the sub-switch, in a state where the main switch is OFF and the sub-switch is ON, and
determining whether a switch current that flows via the main switch when the main switch turns ON will be less than a current threshold value, based on the acquired node voltage information, and
acquiring the node voltage information in a state where the main switch and the sub-switch are OFF, and
determining whether the load is connected to the connector based on the node voltage information acquired in the state where the main switch and the sub-switch are OFF.

2. The switch device according to claim 1, wherein the processing unit executes processing for:
calculating a resistance component value of the load based on the acquired node voltage information, and
determining whether the switch current that flows when the main switch turns ON will be less than the current threshold value, based on the calculated resistance component value.

3. The switch device according to claim 1, wherein the processing unit, in a case of having determined that the load is connected to the connector, executes processing for acquiring the node voltage information in a state where the main switch is OFF and the sub-switch is ON.

4. The switch device according to claim 1, wherein a resistance value of the resistor is greater than the resistance value of the switch circuit when the sub-switch is ON.

5. The switch device according to claim 1, wherein the switch circuit has a second resistor connected in series to the sub-switch.

6. The switch device according to claim 1, wherein the processing unit halts operation, and
the processing unit, in a case of having resumed operation, executes processing for acquiring the node voltage information in a state where the main switch is OFF and the sub-switch is ON.

7. The switch device according to claim 1,
wherein a current that flows when a load having a resistance component value of 0 ohms is connected to the connector and the main switch and the sub-switch are respectively OFF and ON is a normal value that does not cause smoke to be generated.

8. A current determination method in which a computer executes:
  a step of acquiring node voltage information indicating a node voltage of a connection node located downstream of a main switch and a sub-switch, in a state where the main switch is OFF and the sub-switch is ON, the main switch being provided on a first current path from a DC power source to a connector detachably connected to a load and the sub-switch being included in a switch circuit provided on a second current path from the DC power source to the connector; and
  a step of determining whether a switch current that flows via the main switch when the main switch turns ON will be less than a current threshold value, based on the acquired node voltage information,
  wherein a resistance value of the switch circuit when the sub-switch is ON is greater than an ON resistance value of the main switch; and
  acquiring the node voltage information in a state where the main switch and the sub-switch are off; and
  determining whether the load is connected to the connector based on the node voltage information acquired in the state where the main switch and the sub-switch are OFF.

9. A computer program product comprising a non-transitory memory storing instructions and a processer, the processer executing the instructions to perform the steps of:
  acquiring node voltage information indicating a node voltage of a connection node located downstream of a main switch and a sub-switch, in a state where the main switch is OFF and the sub-switch is ON, the main switch being provided on a first current path from a DC power source to a connector detachably connected to a load and the sub-switch being included in a switch circuit provided on a second current path from the DC power source to the connector; and
  determining whether a switch current that flows via the main switch when the main switch turns ON will be less than a current threshold value, based on the acquired node voltage information,
  wherein a resistance value of the switch circuit when the sub-switch is ON is greater than an ON resistance value of the main switch; and
  acquiring the node voltage information in a state where the main switch and the sub-switch are off; and
  determining whether the load is connected to the connector based on the node voltage information acquired in the state where the main switch and the sub-switch are OFF.

10. A switch device comprising:
  a connector detachably connected to a load;
  a main switch provided on a first current path from a DC power source to the connector;
  a switch circuit provided on a second current path from the DC power source to the connector and including a sub-switch;
  a processing unit configured to execute processing,
  wherein a resistance value of the switch circuit when the sub-switch is ON is greater than an ON resistance value of the main switch, and
  the processing unit executes processing for:
    acquiring node voltage information indicating a node voltage of a connection node located downstream of the main switch and the sub-switch, in a state where the main switch is OFF and the sub-switch is ON; and
    determining whether a switch current that flows via the main switch when the main switch turns ON will be less than a current threshold value, based on the acquired node voltage information; and
    acquiring current information indicating the switch current, when the main switch is ON; and
    determining whether the load is connected to the connector based on the acquired current information.

11. A current determination method in which a computer executes:
  a step of acquiring node voltage information indicating a node voltage of a connection node located downstream of a main switch and a sub-switch, in a state where the main switch is OFF and the sub-switch is ON, the main switch being provided on a first current path from a DC power source to a connector detachably connected to a load and the sub-switch being included in a switch circuit provided on a second current path from the DC power source to the connector; and
  a step of determining whether a switch current that flows via the main switch when the main switch turns ON will be less than a current threshold value, based on the acquired node voltage information, wherein a resistance value of the switch circuit when the sub-switch is ON is greater than an ON resistance value of the main switch; and
  acquiring current information indicating the switch current, when the main switch is ON, and
  determining whether the load is connected to the connector based on the acquired current information.

12. A computer program product comprising a non-transitory memory storing instructions and a processer, the processer executing the instructions to perform the steps of:
  acquiring node voltage information indicating a node voltage of a connection node located downstream of a main switch and a sub-switch, in a state where the main switch is OFF and the sub-switch is ON, the main switch being provided on a first current path from a DC power source to a connector detachably connected to a load and the sub-switch being included in a switch circuit provided on a second current path from the DC power source to the connector; and
  determining whether a switch current that flows via the main switch when the main switch turns ON will be less than a current threshold value, based on the acquired node voltage information, wherein a resistance value of the switch circuit when the sub-switch is ON is greater than an ON resistance value of the main switch; and
  acquiring current information indicating the switch current, when the main switch is ON, and
  determining whether the load is connected to the connector based on the acquired current information.

* * * * *